United States Patent
Narutaki et al.

(10) Patent No.: US 10,516,136 B2
(45) Date of Patent: Dec. 24, 2019

(54) MULTILAYER THIN FILM ENCAPSULATION STRUCTURE FOR A ORGANIC ELECTROLUMINESCENT DEVICE

(71) Applicant: Sakai Display Products Corporation, Sakai-shi, Osaka (JP)

(72) Inventors: Yozo Narutaki, Osaka (JP); Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 122 days.

(21) Appl. No.: 15/763,288

(22) PCT Filed: Jun. 13, 2017

(86) PCT No.: PCT/JP2017/021854
§ 371 (c)(1),
(2) Date: Mar. 26, 2018

(87) PCT Pub. No.: WO2018/229876
PCT Pub. Date: Dec. 20, 2018

(65) Prior Publication Data
US 2019/0363288 A1    Nov. 28, 2019

(51) Int. Cl.
*H01L 29/08*    (2006.01)
*H01L 33/00*    (2010.01)
(Continued)

(52) U.S. Cl.
CPC ...... *H01L 51/5253* (2013.01); *H01L 27/3276* (2013.01); *H01L 51/004* (2013.01);
(Continued)

(58) Field of Classification Search
CPC ............. H01L 51/5253; H01L 27/3276; H01L 51/0035; H01L 51/004; H01L 51/56; H01L 51/5256; H01L 51/5237
See application file for complete search history.

(56) References Cited

U.S. PATENT DOCUMENTS 10,276,830 B2 * 4/2019 Kishimoto .......... H01L 51/5256
10,276,837 B2 * 4/2019 Narutaki ................. H01L 51/56
(Continued)

FOREIGN PATENT DOCUMENTS

JP    2002-057162 A    2/2002
JP    2004-047410 A    2/2004
(Continued)

OTHER PUBLICATIONS

Decision to Grant for related Japanese Application No. 2017-564943 dated Mar. 6, 2018.

*Primary Examiner* — Alonzo Chambliss
(74) *Attorney, Agent, or Firm* — Renner, Otto, Boisselle & Sklar, LLP

(57) ABSTRACT

An organic electroluminescent device (100) includes a substrate (1), a driving circuit layer (2), an inorganic protective layer (Pa), an organic flattening layer (Pb), an organic electroluminescent element layer (3), and a TFE structure (10). The TFE structure includes a first inorganic barrier layer (12), an organic barrier layer (14), and a second inorganic barrier layer (16). As seen in a direction of normal to the substrate, the organic flattening layer (Pb) is formed in a region where the inorganic protective layer (Pa) is formed, organic electroluminescent elements are located in a region where the organic flattening layer (Pb) is formed, and an outer perimeter of the TFE structure (10) crosses lead wires (32) and is present between an outer perimeter of the organic flattening layer (Pb) and an outer perimeter of the inorganic protective layer (Pa). In a region where the inorganic protective layer (Pb) and the first inorganic barrier layer (12) are in direct contact with each other on the lead wires (32), a tapering angle θ(12) of a side surface of a cross-section of the first inorganic barrier layer (12) taken along a plane parallel to a width direction of the lead wires (32) is smaller than 90 degrees.

9 Claims, 11 Drawing Sheets

(51) Int. Cl.
  *H01L 31/0232* (2014.01)
  *H01L 31/0203* (2014.01)
  *H01L 21/00* (2006.01)
  *H01L 51/40* (2006.01)
  *H01L 51/52* (2006.01)
  *H01L 27/32* (2006.01)
  *H01L 51/00* (2006.01)
  *H01L 51/56* (2006.01)

(52) U.S. Cl.
  CPC ...... *H01L 51/0035* (2013.01); *H01L 51/5237* (2013.01); *H01L 51/5256* (2013.01); *H01L 51/56* (2013.01)

(56) References Cited

U.S. PATENT DOCUMENTS

| | | |
|---|---|---|
| 2001/0055841 A1 | 12/2001 | Yamazaki et al. |
| 2003/0129790 A1 | 7/2003 | Yamazaki et al. |
| 2005/0231107 A1 | 10/2005 | Yamazaki et al. |
| 2009/0115321 A1* | 5/2009 | Hayashi ............ H01L 51/5246 313/504 |
| 2010/0187986 A1* | 7/2010 | Kajitani ............ H01L 51/524 313/504 |
| 2011/0037068 A1 | 2/2011 | Yamazaki et al. |
| 2016/0043346 A1 | 2/2016 | Kamiya et al. |
| 2016/0126495 A1 | 5/2016 | Oka et al. |
| 2017/0097529 A1 | 4/2017 | Kubota et al. |

FOREIGN PATENT DOCUMENTS

| | | |
|---|---|---|
| JP | 2005-327708 A | 11/2005 |
| JP | 2011-049549 A | 3/2011 |
| JP | 2013-064187 A | 4/2013 |
| JP | 2013-186971 A | 9/2013 |
| JP | 2015-173078 A | 10/2015 |
| JP | 2015-176717 A | 10/2015 |
| JP | 2015-220001 A | 12/2015 |
| JP | 2016-039120 A | 3/2016 |
| JP | 2017-068927 A | 4/2017 |
| KR | 10-2016-0056487 A | 5/2016 |
| WO | WO 2014/196137 A1 | 12/2014 |
| WO | WO 2015/178059 A1 | 11/2015 |

\* cited by examiner (a)

(b)

(a)

(b)

(c)

(a)

(b)

(c)

(d)

(a)

(b)

(a)

(b)

(a)

(b)

(c)

(a)

(b)

(a)

(b)

(c)

MULTILAYER THIN FILM ENCAPSULATION STRUCTURE FOR A ORGANIC ELECTROLUMINESCENT DEVICE

TECHNICAL FIELD

The present invention relates to an organic electroluminescent device (e.g., an organic EL display device and an organic EL illumination device) and a method for producing the same.

BACKGROUND ART

Organic EL (Electro-Luminescent) display devices start being put into practical use. One feature of an organic EL display device is being flexible. An organic EL display device includes, in each of pixels, at least one organic EL element (Organic Light Emitting Diode: OLED) and at least one TFT (Thin Film Transistor) controlling an electric current to be supplied to each of the at least one OLED). Hereinafter, an organic EL display device will be referred to as an "OLED display device". Such an OLED device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display non-unevenness. One technology developed in order to provide an encapsulation structure that protects the OLED against moisture while not spoiling the flexibility of the OLED display device is a thin film encapsulation (TFE) technology. According to the thin film encapsulation technology, inorganic barrier layers and organic barrier layers are stacked alternately to allow thin films to provide a sufficient level of water vapor barrier property. From the point of view of moisture-resistant reliability of the OLED display device, such a thin film encapsulation structure is typically required to have a WVTR (Water Vapor Transmission Rate) less than, or equal to, $1 \times 10^{-4}$ g/m²/day.

A thin film encapsulation structure used in OLED display devices commercially available currently includes an organic barrier layer (polymer barrier layer) having a thickness of about 5 µm to about 20 µm. Such a relatively thick organic barrier layer also has a role of flattening a surface of the element substrate. However, such a thick organic barrier layer involves a problem that the bendability of the OLED display device is limited.

There is also a problem that the mass-productivity is low. The relatively thick organic barrier layer described above is formed by use of a printing technology such as an inkjet method, a microjet method or the like. By contrast, the inorganic barrier layer is formed by a thin film formation technology in a vacuum atmosphere (e.g., less than, or equal to, 1 Pa). The formation of the organic barrier layer by use of a printing method is performed in the air or a nitrogen atmosphere, whereas the formation of the inorganic barrier layer is performed in vacuum. Therefore, the element substrate is put into, and out of, a vacuum chamber during the formation of the thin film encapsulation structure, which decreases the mass-productivity.

In such a situation, as disclosed in, for example, Patent Document 1, a film formation device capable of producing an inorganic barrier layer and an organic barrier layer continuously has been developed.

Patent Document 2 discloses a thin film encapsulation structure including a first inorganic material layer, a first resin member and a second inorganic material layer provided on the element substrate in this order. In this thin film encapsulation structure, the first resin member is present locally, namely, around a protruding portion of the first inorganic material layer (first inorganic material layer covering a protruding component). According to Patent Document 2, the first resin member is present locally, namely, around the protruding component, which may not be sufficiently covered with the first inorganic material layer. With such a structure, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and gasified to be mist-like is supplied onto an element substrate maintained at a temperature lower than, or equal to, room temperature. As a result, the organic material is condensed and put into drops on the substrate. The organic material in drops moves on the substrate by a capillary action or a surface tension to be present locally, namely, at a border between a side surface of the protruding portion and a surface of the element substrate. Then, the organic material is cured to form the first resin member at the border. Patent Document 3 also discloses an OLED display device having a similar thin film encapsulation structure. Patent Document 4 discloses a film formation device usable to produce an OLED display device.

CITATION LIST

Patent Literature

Patent Document No. 1: Japanese Laid-Open Patent Publication No. 2013-186971
Patent Document No. 2: WO2014/196137
Patent Document No. 3: Japanese Laid-Open Patent Publication No. 2016-39120
Patent Document No. 4: Japanese Laid-Open Patent Publication No. 2013-64187

SUMMARY OF INVENTION

Technical Problem

The thin film encapsulation structure described in each of Patent Documents 2 and 3 does not include a thick organic barrier layer, and therefore, are considered to improve the bendability of the OLED display device. In addition, since the inorganic barrier layer and the organic barrier layer may be formed continuously, the mass-productivity is also improved.

However, according to the studies made by the present inventors, an organic barrier layer formed by the method described in Patent Document 2 or 3 has a problem of not providing a sufficient level of moisture-resistant reliability.

In the case where an organic barrier layer is formed by use of a printing method such as an inkjet method or the like, it is possible to form the organic barrier layer only in an active region on the element substrate (the active region may also be referred to as an "element formation region" or a "display region") but not in a region other than the active region. In this case, in the vicinity of the active region (outer to the active region), there is a region where the first inorganic material layer and the second inorganic material layer are in direct contact with each other, and the organic barrier layer is fully enclosed by the first inorganic material layer and the second inorganic material layer and is insulated from the outside of the first inorganic material layer and the second inorganic material layer.

By contrast, according to the method for forming the organic barrier layer described in Patent Documents 2 or 3, a resin (organic resin) is supplied to the entire surface of the element substrate, and the surface tension of the resin in a liquid state is used to distribute the resin at the border between the surface of the substrate and the side surface of the protruding portion on the surface of the element substrate. Therefore, the organic barrier layer may also be formed in a region other than the active region (the region other than the active region may also be referred to as a "peripheral region"), namely, a terminal region where a plurality of terminals are located and a lead wire region where lead wires extending from the active region to the terminal region are formed. Specifically, the resin is present locally, namely, at, for example, the border between the surface of the substrate and side surfaces of the lead wires or side surfaces of the terminals. In this case, an end of the organic barrier layer formed along the lead wires is not enclosed by the first inorganic barrier layer and the second inorganic barrier layer, but is exposed to the air (ambient atmosphere).

The organic barrier layer is lower in the water vapor barrier property than the inorganic barrier layer. Therefore, the organic barrier layer formed along the lead wires acts as a route that leads the water vapor in the air to the active region.

Herein, the problems of the thin film encapsulation structure preferably usable for a flexible organic EL display device have been described. The thin film encapsulation structure is usable for another organic EL device such as an organic EL illumination device or the like as well as for the organic EL display device.

The present invention, made to solve the above-described problems, has an object of providing an organic EL device that includes a thin film encapsulation structure including a relatively thin organic barrier layer and is improved in the mass-productivity and the moisture-resistant reliability, and a method for producing the same.

Solution to Problem

An organic EL device in an embodiment according to the present invention includes a substrate; a driving circuit layer including a plurality of TFTs formed on the substrate, a plurality of gate bus lines and a plurality of source bus lines each connected with any of the plurality of TFTs, a plurality of terminals, and a plurality of lead wires connecting each of the plurality of terminals with either one of the plurality of gate bus lines or either one of the plurality of source bus lines; an inorganic protective layer formed on the driving circuit layer and exposing at least the plurality of terminals; an organic flattening layer formed on the inorganic protective layer; an organic EL element layer formed on the organic flattening layer and including a plurality of organic EL elements each connected with either one of the plurality of TFTs; and a thin film encapsulation structure formed to cover the organic EL element layer, the thin film encapsulation structure including a first inorganic barrier layer, an organic barrier layer in contact with a top surface of the first inorganic barrier layer, and a second inorganic barrier layer in contact with a top surface of the organic barrier layer, the organic barrier layer being formed in a region enclosed by an inorganic barrier layer joint portion where the first inorganic barrier layer and the second inorganic barrier layer are in direct contact with each other. As seen in a direction of normal to the substrate, the organic flattening layer is formed in a region where the inorganic protective layer is formed, the plurality of organic EL elements are located in a region where the organic flattening layer is formed, and an outer perimeter of the thin film encapsulation structure crosses the plurality of lead wires and is present between an outer perimeter of the organic flattening layer and an outer perimeter of the inorganic protective layer. In a region where the inorganic protective layer and the first inorganic barrier layer are in direct contact with each other on the plurality of lead wires, a tapering angle of a side surface of a cross-section of the first inorganic barrier layer taken along a plane parallel to a width direction of the plurality of lead wires is smaller than 90 degrees. It is preferred that the tapering angle of the side surface of the first inorganic barrier layer is smaller than 70 degrees.

The organic flattening layer is formed of, for example, a photosensitive resin. It is preferred that the organic flattening layer is formed of polyimide.

A method for producing the organic EL device in an embodiment according to the present invention includes step A of forming the driving circuit layer on the substrate; step B of forming the inorganic protective layer on the driving circuit layer; step C of forming the organic flattening layer on the inorganic protective layer; step D of heating the organic flattening layer to a temperature higher than, or equal to, 200° C.; and step E of forming the organic EL element layer on the organic flattening layer after the step of heating. The step D may be a step of heating the organic flattening layer to a temperature higher than, or equal to, 300° C.

The method in an embodiment further includes step C1 of forming a positive photoresist film covering the organic flattening layer and step C2 of exposing and then developing the entirety of the photoresist film to remove the photoresist film, the step C1 and the step C2 being performed after the step C but before the step D. The method may further include the step of storing or transporting the substrate having the photoresist film formed thereon between the step C1 and the step C2.

The method in an embodiment according to the present invention includes step F of, after the step E, forming the first inorganic barrier layer selectively in an active region where the plurality of organic EL elements are formed; step G of, after the step F, locating the substrate in a chamber and supplying a vapor-like or mist-like photocurable resin into the chamber; step H of condensing the photocurable resin on the first inorganic barrier layer such that the photocurable resin is not present on a part of the first inorganic barrier layer, the part having the tapering angle smaller than 90 degrees; and step I of, after the step H, irradiating the condensed photocurable resin with light to form the organic barrier layer of the photocurable resin.

The method in an embodiment according to the present invention includes step F, after the step E, forming the first inorganic barrier layer selectively in an active region where the plurality of organic EL elements are formed; step G of, after the step F, locating the substrate in a chamber and supplying a vapor-like or mist-like photocurable resin into the chamber; step H of condensing the photocurable resin on the first inorganic barrier layer to form a liquid film; step I of irradiating the liquid film of the photocurable resin with light to form a photocurable resin layer; and step J of partially ashing the photocurable resin layer to form the organic barrier layer.

Advantageous Effects of Invention

An embodiment of the present invention provides an organic EL display device that includes a thin film encapsulation structure including a relatively thin organic barrier layer and is improved in the mass-productivity and the moisture-resistant reliability, and a method for producing the same.

BRIEF DESCRIPTION OF DRAWINGS

FIG. 3(a) is a cross-sectional view taken along line 3A-3A' in FIG. 2, FIG. 3(b) is a cross-sectional view taken along line 3B-3B' in FIG. 2.

FIG. 4(a) is a cross-sectional view taken along line 4A-4A' in FIG. 2, FIG. 4(b) is a cross-sectional view taken along line 48-48' in FIG. 2, FIG. 4(a) is a cross-sectional view taken along line 4C-4C' in FIG. 2, and FIG. 4(d) is a cross-sectional view taken along line 4D-4D' in FIG. 2.

FIG. 7(a) is a cross-sectional view taken along line 7A-7A' in FIG. 6, and FIG. 7(b) is a cross-sectional view taken along line 78-78' in FIG. 6.

FIG. 8(a) is a cross-sectional view taken along line BA-8A' in FIG. 6, FIG. 8(b) is a cross-sectional view taken along line 8B-8B' in FIG. 6, and FIG. 8(c) is a cross-sectional view taken along line 8C-8C' in FIG. 6.

FIG. 11(a) shows a state of the film formation device 200 in a step of condensing a photocurable resin on a first inorganic barrier layer, and FIG. 11(b) shows a state of the film formation device 200 in a step of curing the photocurable resin.

DESCRIPTION OF EMBODIMENTS

Hereinafter, preferred embodiments of an OLED display device and a method for producing the same in an embodiment according to the present invention will be described with reference to the drawings. In the following, an OLED display device including a flexible substrate will be described. An embodiment of the present invention is not limited to being directed to an organic EL display device, and may be directed to another organic EL device such as an organic EL illumination device. The present invention is not limited to any of the embodiments described below.

Figure 1:
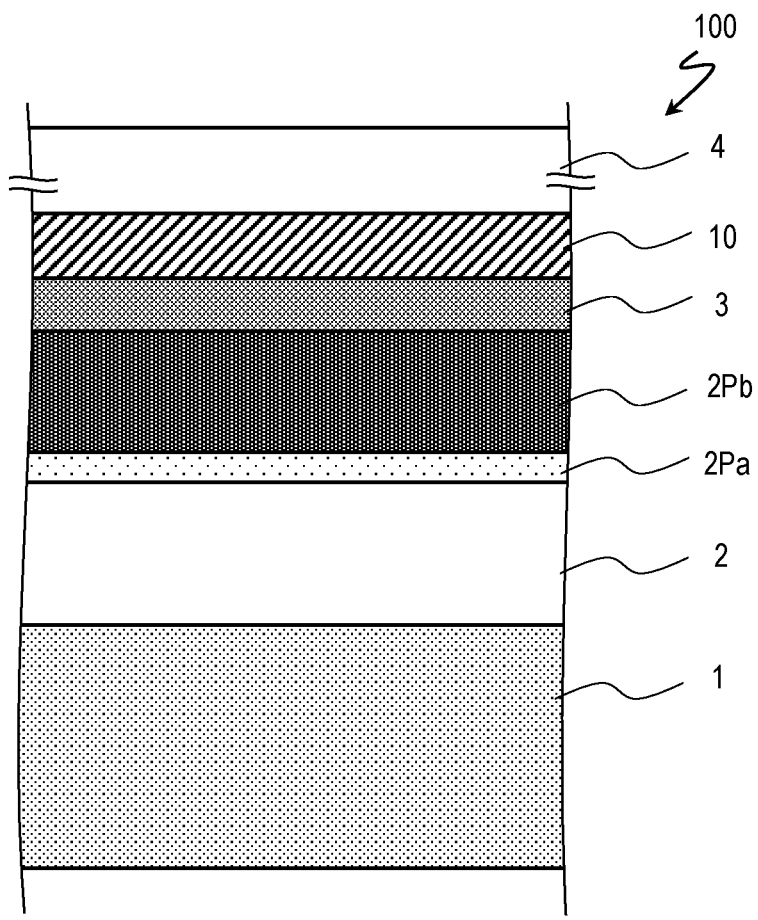
FIG. 1(a) is a schematic partial cross-sectional view of an active region of an OLED display device 100 in an embodiment according to the present invention.
FIG. 1(b) is a partial cross-sectional view of a TFE structure formed on an OLED 3.
Figure 1:
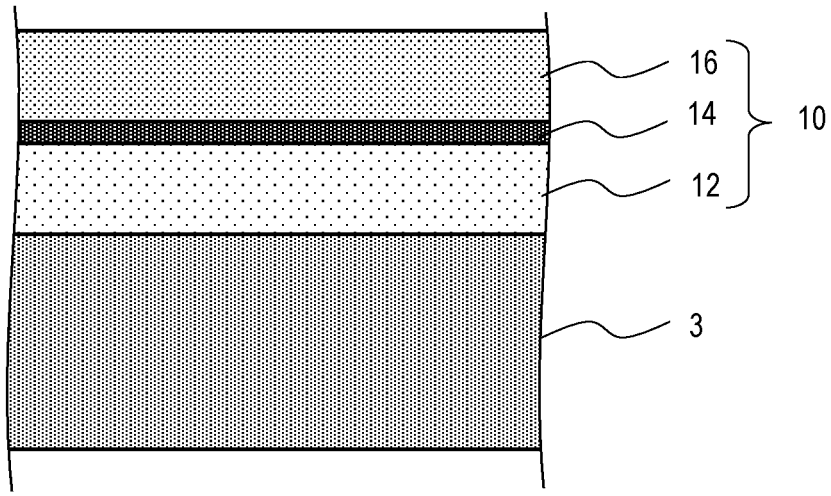

First, a basic structure of an OLED display device 100 in an embodiment according to the present invention will be described with respect to FIG. 1(a) and FIG. 1(b). FIG. 1(a) is a schematic partial cross-sectional view of an active region of the OLED display device 100 in an embodiment according to the present invention. FIG. 1(b) is a partial cross-sectional view of a TFE structure 10 formed on an OLED 3.

The OLED display device 100 includes a plurality of pixels, and each of the pixels includes at least one organic EL element (OLED). Herein, a structure corresponding to one OLED will be described for simplicity.

As shown in FIG. 1(a), the OLED display device 100 includes a flexible substrate (hereinafter, may be referred to simply as a "substrate") 1, a circuit 2 including a TFT that is formed on the substrate 1 (the circuit may be referred to as a "driving circuit" or a "back plane circuit"), an inorganic protective layer 2Pa formed on the circuit 2, an organic flattening layer 2Pb formed on the inorganic protective layer 2Pa, the OLED 3 formed on the organic flattening layer 2Pb, and the TFE structure 10 formed on the OLED 3. The OLED 3 is, for example, of a top emission type. An uppermost portion of the OLED 3 is, for example, a top electrode or a cap layer (refractive index adjusting layer). A layer including a plurality of the OLEDs 3 may be referred to as an "OLED layer 3". An optional polarization plate 4 is located on the TFE structure 10. The circuit 2 and the OLED 3 may share at least one component. In addition, a layer having a touch panel function may be located between the TFE structure 10 and the polarization plate 4. Namely, the OLED display device 100 may be altered to a display device including an on-cell type touch panel.

The substrate 1 is, for example, a polyimide film having a thickness of 15 μm. The circuit 2 including the TFT has a thickness of, for example, 4 μm. The inorganic protective layer 2Pa has a structure of, for example, $SiN_x$ layer (500 nm)/$SiO_2$ layer (100 nm) (top layer/bottom layer). Alternatively, the inorganic protective layer 2Pa may have a three-layer structure of $SiO_2$ layer/$SiN_x$ layer/$SiO_2$ layer. The thickness of the layers are, for example, 200 nm/300 nm/100 nm. The organic flattening layer 2Rb is, for example, a photosensitive acrylic resin layer or a photosensitive polyimide layer having a thickness of 4 μm. The OLED 3 has a thickness of, for example, 1 μm. The TFE structure 10 has a thickness of, for example, less than, or equal to, 2.5 μm.

FIG. 1(b) is a partial cross-sectional view of the TFE structure 10 formed on the OLED 3. A first inorganic barrier layer (e.g., $SiN_x$ layer) 12 is formed immediately on the OLED 3. An organic barrier layer (e.g., acrylic resin layer) 14 is formed on the first inorganic barrier layer 12. A second inorganic barrier layer (e.g., $SiN_x$ layer) 16 is formed on the organic barrier layer 14.

The first inorganic barrier layer 12 is, for example, an $SiN_x$ layer having a thickness of 1.5 μm. The second inorganic barrier layer 16 is, for example, an $SiN_x$ layer having a thickness of 800 nm. The organic barrier layer 14 is, for example, an acrylic resin layer having a thickness less than 100 nm. The first inorganic barrier layer 12 and the second inorganic barrier layer 16 independently have a thickness of 200 nm or greater and 1500 nm or less. The organic barrier layer 14 has a thickness of 50 nm or greater and less than 200 nm. The TFE structure 10 has a thickness of preferably 400 nm or greater and less than 3 μm, and more preferably of 400 nm or greater and 2.5 μm or less.

The TFE structure 10 is formed to protect the active region (see active region R1 in FIG. 2) of the OLED display device 100. At least in the active region R1, there are the first inorganic barrier layer 12, the organic barrier layer 14 and the second inorganic barrier layer 16 formed in this order on the OLED 3, with the first inorganic barrier layer 12 being closest to the OLED 3. The organic barrier layer 14 is not present as a film covering the entirety of the active region R1, but has an opening. A part of the organic barrier layer 14 other than the opening, namely, a part actually formed of an organic film, will be referred to as a "solid portion". The organic barrier layer 14 may be formed by, for example, the method described in Patent Document 1 or 2 or by use of a film formation device 200 described below.

The "opening" (may be referred to also as a "non-solid portion") does not need to be enclosed by the solid portion, but may have a cutout or the like. In the opening, the first inorganic barrier layer 12 and the second inorganic barrier layer 16 are in direct contact with each other. Hereinafter, a portion where the first inorganic barrier layer 12 and the second inorganic barrier layer 16 are in direct contact with each other will be referred to as an "inorganic barrier layer joint portion".

Now, with reference to FIG. 2 and FIG. 3, a structure of the OLED display device 100 and a method for producing the same in an embodiment according to the present invention will be described.

Figure 2:
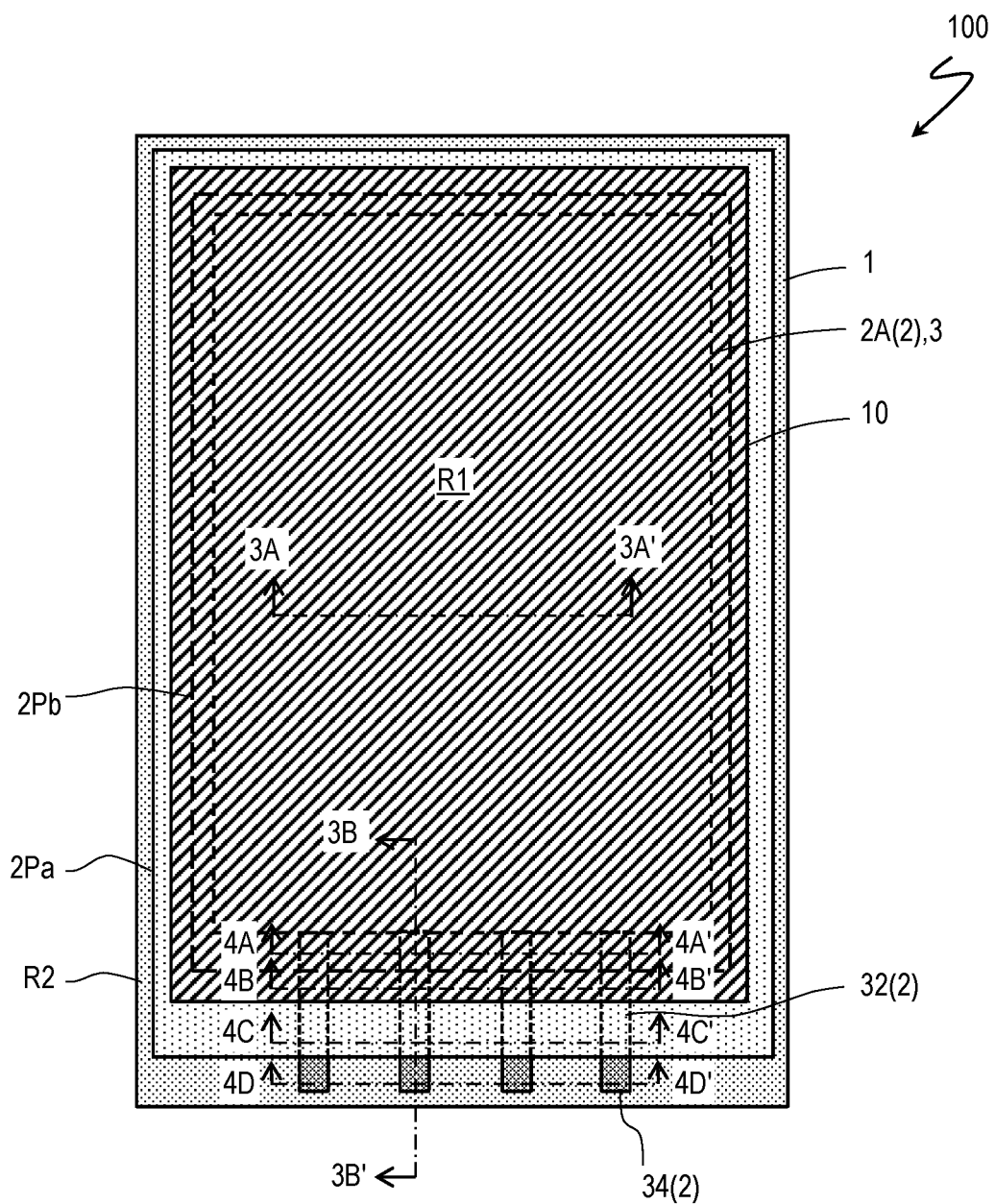
FIG. 2 is a schematic plan view of the OLED display device 100 in an embodiment according to the present invention.
Figure 3:
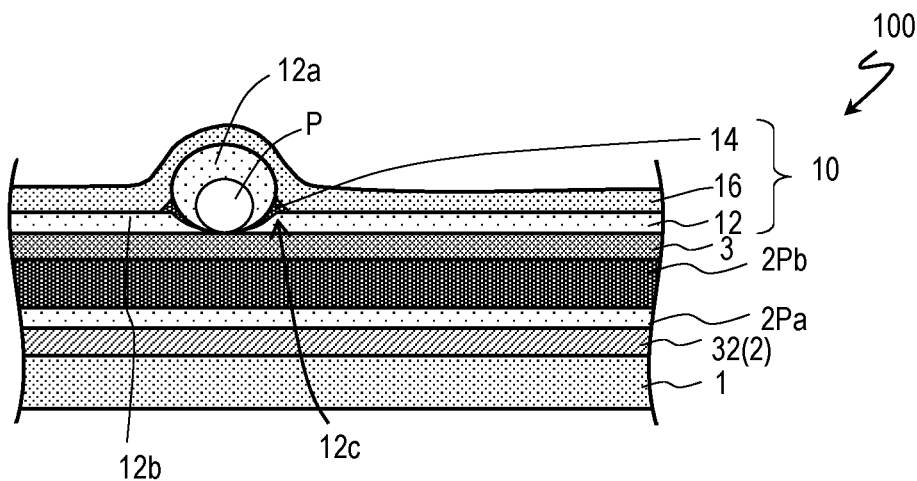
FIG. 3(a) and FIG. 3(b) are each a schematic cross-sectional view of the OLED display device 100.
FIG. 3(c) is a cross-sectional view showing a tapering angle θ of a side surface of each of layers.
Figure 3:
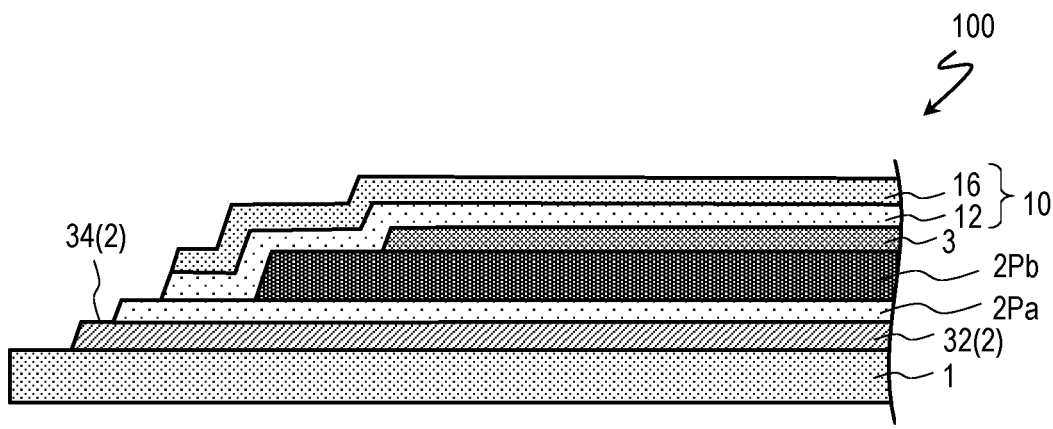
Figure 3:
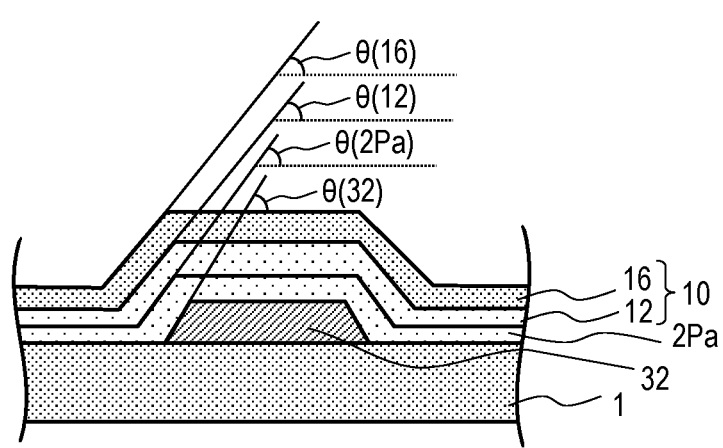
Figure 4:
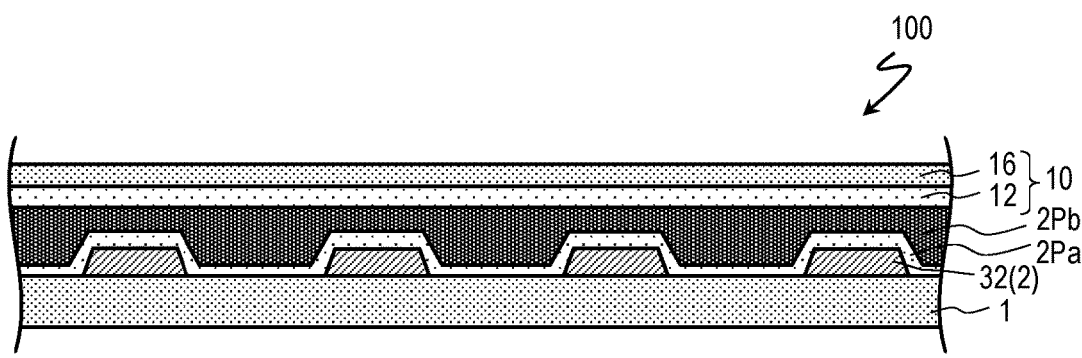
FIG. 4(a) through FIG. 4(d) are each a schematic cross-sectional view of the OLED display device 100.
Figure 4:
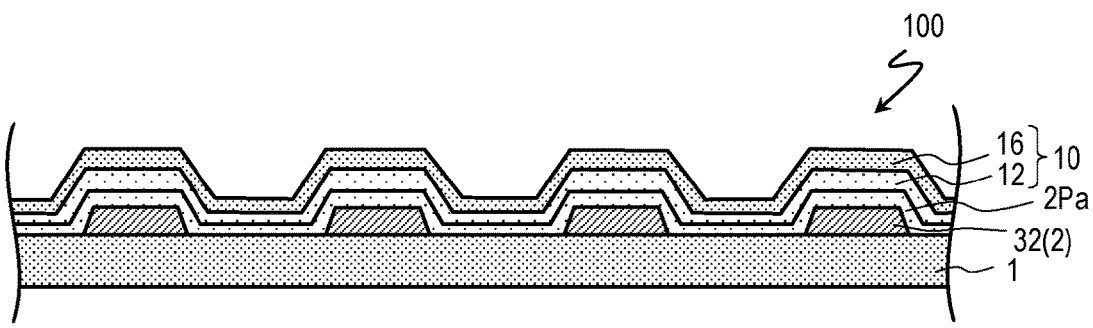
Figure 4:
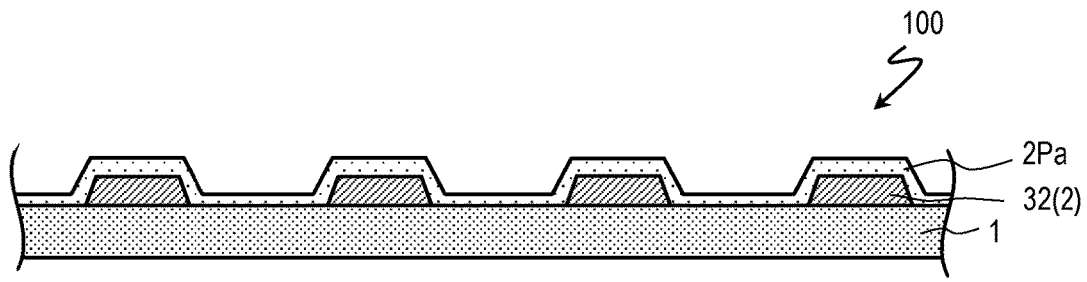
Figure 4:
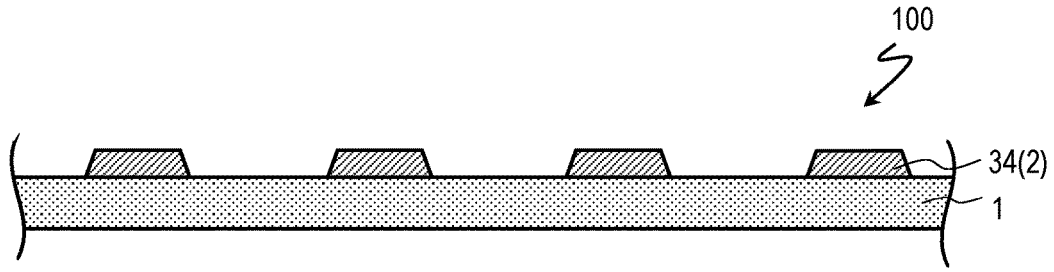

FIG. 2 is a schematic plan view of the OLED display device 100 in an embodiment according to the present invention. With reference to FIG. 3(a) through FIG. 3(a) and FIG. 4(a) through FIG. 4(d), a cross-sectional structure of the OLED display device 100 will be described. FIG. 3(a) and FIG. 3(b) are each a schematic cross-sectional view of the OLED display device 100. FIG. 3(a) is a cross-sectional view taken along line 3A-3A' in FIG. 2, and FIG. 3(b) is a cross-sectional view taken along line 3B-3B' in FIG. 2. FIG. 3(c) is a cross-sectional view showing a tapering angle θ of a side surface of each of the layers. FIG. 4(a) through FIG. 4(d) are each a schematic cross-sectional view of the OLED display device 100. FIG. 4(a) is a cross-sectional view taken along line 4A-4A' in FIG. 2. FIG. 4(b) is a cross-sectional view taken along line 43-43' in FIG. 2. FIG. 4(c) is a cross-sectional view taken along line 4C-4C' in FIG. 2. FIG. 4(d) is a cross-sectional view taken along line 4D-4D' in FIG. 2.

First, FIG. 2 will be referred to. The circuit 2 formed on the substrate 1 includes a plurality of the TFTs (not shown), and a plurality of gate bus lines (not shown) and a plurality of source bus lines (not shown) each connected to any of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The circuit 2 further includes a plurality of terminals 34 located in a peripheral region R2 outer to the active region (region enclosed by the dashed line in FIG. 2) R1 where the plurality of OLEDs 3 are located, and a plurality of lead wires 32 connecting each of the plurality of terminals 34 and either one of the plurality of gate bus lines or either one of the plurality of source bus lines to each other. The entirety of the circuit 2 including the plurality of TFTs, the plurality of gate bus lines, the plurality of source bus lines, the plurality of lead wires 32 and the plurality of terminals 34 may be referred to as a "driving circuit layer 2". A part of the driving circuit layer 2 that is formed in the active region R1 is represented as a "driving circuit layer 2A".

In FIG. 2 and the like, only the lead wires 32 and/or only the terminals 34 may be shown as components of the driving circuit layer 2. Nonetheless, the driving circuit layer 2 includes a conductive layer including the lead wires 32 and the terminals 34, and also includes at least one conductive layer, at least one insulating layer and at least one semiconductor layer. The structure of each of the conductive layer, the insulating layer and the semiconductor layer included in the driving circuit layer 2 may be changed by, for example, the structure of the TFT described below with reference to FIG. 9(a) and FIG. 9(b). On the substrate 1, an insulating layer (base coat) may be formed as an underlying film for the driving circuit layer 2.

As seen in a direction normal to the substrate 1, the organic flattening layer 2Pb is formed in a region where the inorganic protective layer 2Pa is formed, and the active region R1 (2A, 3) is located in a region where the organic flattening layer 2Pb is formed. An outer perimeter of the thin film encapsulation structure 10 crosses the plurality of lead wires 32, and is present between an outer perimeter of the organic flattening layer 2Pb and an outer perimeter of the inorganic protective layer 2Pa. Therefore, the organic flattening layer 2Pb, together with the OLED 3, is enclosed by a joint portion where the inorganic protective layer 2Pa and the first inorganic barrier layer 12 are in direct contact with each other (see FIG. 3(b) and FIG. 4(b)). The inorganic protective layer 2Pa is formed to expose at least the plurality of terminals 34. The inorganic protective layer 2Pa may be formed as follows: an inorganic protective film is once formed to cover the terminals 34 and is subjected to a photolithography process to form the inorganic protective layer 2Pa having an opening exposing the terminals 34.

The inorganic protective layer 2Pa protects the driving circuit layer 2. The organic flattening layer 2Pb flattens a surface of an underlying layer on which the OLED layer 3 is to be formed. Like the organic barrier layer 14, the organic flattening layer 2Pb is lower in the water vapor barrier property than the inorganic protective layer 2Pa or the inorganic barrier layers 12 and 16. Therefore, in the case where an organic flattening layer is partially exposed to the air (ambient atmosphere) like an organic flattening layer 2Pbc of an OLED display device 100C shown in FIG. 6 through FIG. 8, moisture is absorbed by the organic flattening layer from the part exposed to the air. As a result, the organic flattening layer 2Pbc acts as a route that guides water vapor in the air to the active region R1. As described above, in the OLED display device 100 in the embodiment, the organic flattening layer 2Pb is enclosed by the joint portion where the inorganic protective layer 2Pa and the first inorganic barrier layer 12 are in direct contact with each other. Therefore, moisture is prevented from being guided to the active region R1 via the organic flattening layer 2Pb.

It is preferred that the organic flattening layer 2Pb is formed of a photosensitive resin. The organic flattening layer 2Pb is formed by use of any of various coating methods and printing methods. The organic flattening layer 2Pb, in the case of being formed of a photosensitive resin, is easily formed in a predetermined region by a photolithography process. The photosensitive resin may be positive or negative. A photosensitive acrylic resin or a photosensitive polyimide resin is preferably usable. In the case where a photoresist is used separately, a resin that is not photosensitive may be used to form the organic flattening layer 2Pb.

It is preferred to heat (bake) the organic flattening layer 2Pb in order to remove moisture contained therein before the OLED layer 3 is formed on the organic flattening layer 2Pb. The heating temperature is preferably, for example, higher than, or equal to, 200° C. (e.g., for longer than, or equal to, 1 hour), and more preferably higher than, or equal to, 300° C. (e.g., for longer than, or equal to, 15 minutes). The heating may be performed at an atmospheric pressure. It is preferred that the resin material used to form the organic flattening layer 2Pb is highly heat-resistant so as not to be thermally deteriorated in the heating (baking) step. For example, the resin material is preferably polyimide.

After the organic flattening layer 2Pb is formed but before the OLED layer 3 is formed, an element substrate may be stored or transported. Namely, after the element substrate including the driving circuit layer 2, the inorganic protective layer 2Pa and the organic flattening layer 2Pb is formed but before the OLED layer 3 is formed, there may be some time (for example, the element substrate may be stored for at least one day, e.g., for several days) or the element substrate may be transported to another plant. In order to prevent a surface of the organic flattening layer 2Pb from being contaminated during this period or to prevent dust from being attached to the surface of the organic flattening layer 2Pb during the transportation, for example, a positive photoresist film covering the organic flattening layer 2Pb may be formed. It is preferred that the photoresist film is formed by supplying and then prebaking a photoresist solution (the solvent is volatilized and thus removed by, for example, being heated in a temperature range of about 90° C. or higher to about 110° C. or lower for about 5 minutes to about 30 minutes). The photoresist film may be removed after the storage or the transportation but immediately before the OLED layer 3 is formed, so that the organic flatting layer 2Pb has a clean surface. In order to remove the photoresist film, it is preferred that the entire surface of the photoresist film is exposed and then developed without performing usual a post-prebake treatment. A material preferably usable to form the positive photoresist film is, for example, product name OFPR-800 produced by Tokyo Ohka Kogyo Co., Ltd.), which is a positive photoresist.

Now, with reference to FIG. 3(a) through FIG. 3(c) and FIG. 4(a) through FIG. 4(d), the cross-sectional structure of the OLED display device 100 will be described in more detail.

As shown in FIG. 3(a), FIG. 3(b), FIG. 4(a) and FIG. 4(b), the TFE structure 10 includes the first inorganic barrier layer 12 formed on the OLED 3, the organic barrier layer 14 in contact with the first inorganic barrier layer 12, and the second inorganic barrier layer 16 in contact with the organic barrier layer 14. The first inorganic barrier layer 12 and the second inorganic barrier layer 16 are each, for example, an $SiN_x$ layer and are selectively formed in a predetermined region so as to cover the active region R1 by plasma CVD using a mask.

The organic barrier layer 14 may be formed by, for example, the method described in Patent Document 2 or 3. For example, a vapor-like or mist-like organic material (e.g., acrylic monomer) is supplied, in a chamber, onto the element substrate maintained at a temperature lower than, or equal to, room temperature, is condensed on the element substrate, and is located locally, namely, at a border between a side surface of a protruding portion and a flat portion of the first inorganic barrier layer 12 by a capillary action or a surface tension of the organic material in a liquid state. Then, the organic material is irradiated with, for example, ultraviolet rays to form a solid portion of the organic barrier layer (e.g., acrylic resin layer) 14 in a border region in the vicinity of the protruding portion. The organic barrier layer 14 formed by this method does not substantially include a solid portion in the flat portion. Regarding the method for forming the organic barrier layer, the disclosures of Patent Documents 2 and 3 are incorporated herein by reference.

Alternatively, the organic barrier layer 14 may be formed by adjusting an initial thickness of the resin layer to be formed by use of the film formation device 200 (e.g., to less than 100 nm) and/or by performing an ashing process on the resin layer once formed. As described below, the ashing process may be performed by plasma ashing using, for example, at least one type of gas among $N_2O$, $O_2$ and $O_3$.

FIG. 3(a) is a cross-sectional view taken long line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle is easily generated in the case where mask vapor deposition is used.

As shown in FIG. 3(a), the organic barrier layer (solid portion) 14 may be formed only in the vicinity of the particle P. A reason for this is that the acrylic monomer supplied after the first inorganic barrier layer 12 is formed is condensed and present locally, namely, in the vicinity of a surface of the first inorganic barrier layer 12 that is on the particle P (the surface has a tapering angle larger than, or equal to, 90 degrees). There is the opening (non-solid portion) of the organic barrier layer 14 on the flat portion of the first inorganic barrier layer 12.

In the case where the particle P (having a diameter of, for example, greater than, or equal to, 1 μm) is present, the first inorganic barrier layer 12 may have a crack (void) 12c. This is considered to be caused by impingement of an $SiN_x$ layer 12a growing from a surface of the particle P and an $SiN_x$ layer 12b growing from a flat portion of a surface of the OLED 3 In the case where such a crack 12c is present, the barrier property level of the TFE structure 10 is decreased.

As shown in FIG. 3(a), in the TFE structure 10 of the OLED display device 100, the organic barrier layer 14 is formed to fill the crack 120 of the first inorganic barrier layer 12, and a surface of the organic barrier layer 14 couples a surface of the first inorganic barrier layer 12a on the particle P and a surface of the first inorganic barrier layer 12b on the flat portion of the OLED 3 continuously and smoothly. Therefore, no void is caused in the first inorganic barrier layer 12 on the particle P or in the second inorganic barrier layer 16 formed on the organic barrier layer 14, and thus the first inorganic barrier layer 12 and the second inorganic barrier layer 16 are formed to be fine. As can be seen, even in the case where the particle P is present, the organic barrier layer 14 retains the barrier property level of the TFE structure 10.

Now, with reference to FIG. 3(b) and FIG. 4(a) through FIG. 4(d), the cross-sectional structure on the lead wire 32 and the terminal 34 will be described.

As shown in FIG. 3(b), the lead wire 32 and the terminal 34 are integrally formed on the substrate 1. The inorganic protective layer 2Pa is formed on the lead wire 32 so as to expose the terminal 34. On the inorganic protective layer 2Pa, the organic flattening layer 2Pb is formed. On the organic flattening layer 2Pb, the OLED layer 3 is formed.

The TFE structure 10 is formed so as to cover the OLED layer 3 and the organic flattening layer 2Pb. The OLED layer 3 and the organic flattening layer 2Pb are enclosed by the joint portion where the inorganic protective layer 2Pa and the first inorganic barrier layer 12 are in direct contact with each other. The organic barrier layer (solid portion) 14 between the first inorganic barrier layer 12 and the second inorganic barrier layer 16 of the TFE structure 10 is formed only around the protruding portion such as the particle or the like, and thus is not shown in FIG. 3(b). The organic barrier layer (solid portion) 14 is enclosed by the inorganic barrier layer joint portion where the first inorganic barrier layer 12 and the second inorganic barrier layer 16 are in direct contact with each other.

As shown in FIG. 4(a), in a region close to the active region R1 (cross-section taken along line 4A-4A' in FIG. 2), the inorganic protective layer 2Pa, the organic flattening layer 2Pb and the TFE structure 10 are formed on the lead wire 32.

As shown in FIG. 4(b), in a cross-section taken along line 4B-4B' in FIG. 2, the inorganic protective layer 2Pa and the first inorganic barrier layer 12 are in direct contact with each other, and the organic flattening layer 2Pb is enclosed by the joint portion where the joint portion where the inorganic protective layer 2Pa and the first inorganic barrier layer 12 are in direct contact with each other (see FIG. 2 and FIG. 3(b)).

As shown in FIG. 4(c), in a region close to the terminal 34, only the inorganic protective layer 2Pa is formed on the lead wire 32.

As shown in FIG. 4(d), the terminal 34 is exposed from the inorganic protective layer 2Pa and is used to electric connection with an external circuit (e.g., FPC (Flexible Printed Circuit)).

A region including the regions shown in FIG. 4(b) through FIG. 4(d) is not covered with the organic flattening layer 22b. Therefore, in this region, the organic barrier layer (solid portion) may be formed during the formation of the organic barrier layer 14 of the TFE structure 10. For example, in the case where a side surface of a cross-section of this region taken along a plane parallel to a width direction of the lead wire 32 has a tapering angle θ larger than, or equal to, 90 degrees, the organic barrier layer may be formed along a side surface of the lead wire 32. However, as shown in FIG. 4(b) through FIG. 4(d), in the OLED display device 100 in the embodiment, the tapering angle θ of the side surface of a cross-section of the lead wire 32 and the terminal 34 at least in this region is smaller than 90 degrees, and no photocurable resin is present locally. Therefore, the organic barrier layer (solid portion) is not formed along the side surface of the lead wire 32 and the terminal 34.

Now, with reference to FIG. 3(c), the tapering angle θ of the side surface of each of the layers will be described. FIG. 3(c) is a cross-sectional view showing the tapering angle θ of the side surface of each of the layers, and corresponds to, for example, the cross-sectional view shown in FIG. 4(b). As shown in FIG. 3(c), the tapering angle of the side surface of the cross-section of the lead wire 32 taken along the width direction thereof is represented as θ(32). Regarding each of the other layers, the tapering angle of the side surface of the cross-section thereof taken along the width direction thereof is represented as θ(reference sign of the layer).

The tapering angles θ of the inorganic protective layer 2Pa formed on the lead wire 32, and the first inorganic barrier layer 12 and the second inorganic barrier layer 16 of the TFE structure 10 formed on the inorganic protective layer 2Pa satisfy the relationship of θ(32)≥θ(2Pa)≥θ(12)≥θ (16). Therefore, in the case where the tapering angle θ(32) of the side surface of the lead wire 32 is smaller than 90 degrees, the tapering angle of the side surface of the inorganic protective layer 2Pa, namely, θ(2Pa), and the tapering angle of the side surface of the first inorganic barrier layer 12, namely, θ(12), are also smaller than 90 degrees.

In the case where the tapering angles of the side surfaces are larger than, or equal to, 90 degrees, if the method for forming the organic barrier layer described in Patent Document 2 or 3 is used, a vapor-like or mist-like organic material (e.g., acrylic monomer) is condensed along a border between the side surface and the flat surface (making an angle smaller than, or equal to, 90 degrees), and thus the organic barrier layer (solid portion) is formed. When this occurs, for example, the organic barrier layer (solid portion) formed along the lead wire acts as a route that guides water vapor in the air to the active region.

Figure 5:
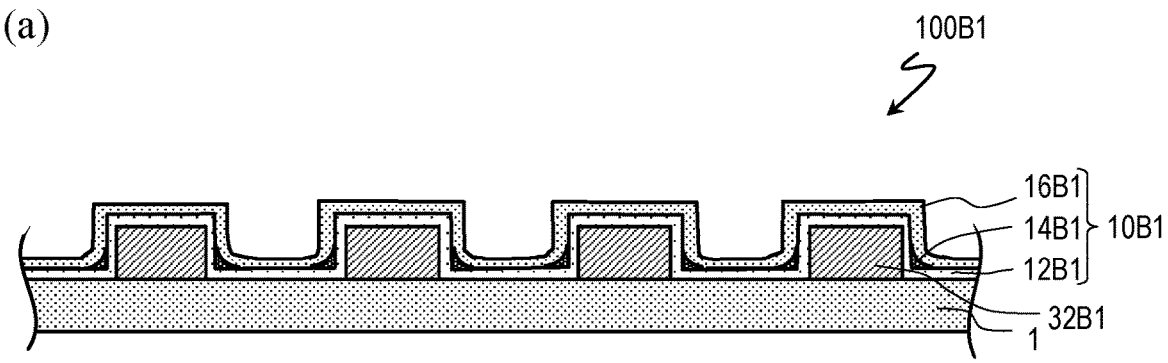
FIG. 5(a) and FIG. 5(b) are respectively schematic cross-sectional views of OLED display devices 10081 and 100B2 in comparative examples, the cross-sectional views corresponding to FIG. 4(b).
Figure 5:
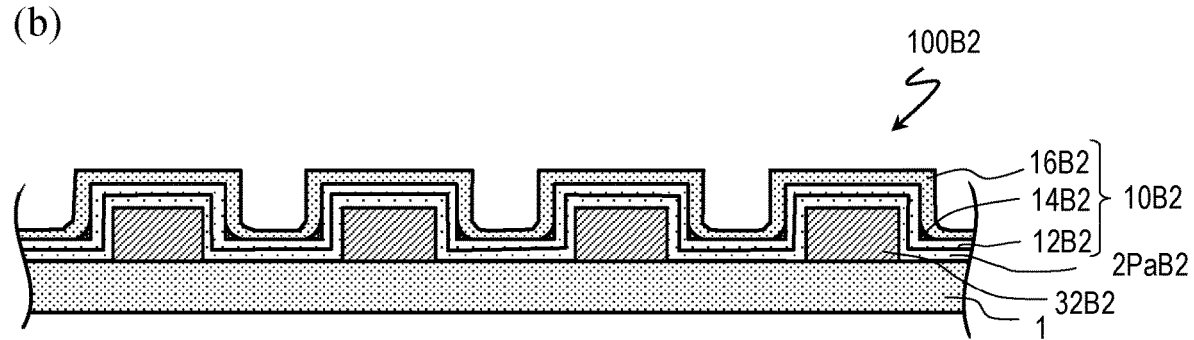

As shown in FIG. 5(a), which is a schematic cross-sectional view of an OLED display device 100B1 in a comparative example and corresponds to FIG. 4(b), in the case where a tapering angle θ(32B1) of a side surface of a lead wire 32B1 and a tapering angle θ(12B1) of a side surface of a first inorganic barrier layer 12B1 are each larger than, or equal to, 90 degrees, an organic barrier layer (solid portion) 14B1 is formed along a side surface of the first inorganic barrier layer 12B1 of a TFE structure 10B1, between the first inorganic barrier layer 12B1 and a second inorganic barrier layer 16B1. The OLED display device 10B1, for example, may be altered from the OLED display device 100 in the above-described embodiment such that the inorganic protective layer 2Pa is omitted and such that the tapering angle θ(32) of the side surface of the lead wire 32 and the tapering angle θ(12) of the side surface of the first inorganic barrier layer 12 are each changed to be larger than, or equal to, 90 degrees.

As shown in FIG. 5(b), which is a schematic cross-sectional view of an OLED display device 100B2 in a comparative example and corresponds to FIG. 4(b), in the case where tapering angles θ(32B2), θ(2PaB2) and θ(12B2) of side surfaces of a lead wire 32B2, an inorganic protective layer 2PaB2 and a first inorganic barrier layer 12B2 are each larger than, or equal to, 90 degrees, an organic barrier layer (solid portion) 14B2 is formed along a side surface of the first inorganic barrier layer 12B2 of a TFE structure 10B2, between the first inorganic barrier layer 12B2 and a second inorganic barrier layer 16B2. The OLED display device 10B2, for example, may be altered from the OLED display device 100 in the above-described embodiment such that the tapering angle θ(32) of the side surface of the lead wire 32 and the tapering angle θ(12) of the side surface of the first inorganic barrier layer 12 are each changed to be larger than, or equal to, 90 degrees.

Unlike the OLED display device 100B1, the OLED display device 100B2 includes the inorganic protective layer 2PaB2. Therefore, the tapering angle θ(122) of the side surface of the first inorganic barrier layer 12B2 tends to be smaller than the tapering angle θ(12B1) of the first inorganic barrier layer 12B1 of the OLED display device 100B1.

In the OLED display device 100 in the above-described embodiment according to the present invention shown in FIG. 4(b) through FIG. 4(d), the tapering angles θ(32), θ(2Pa) and θ(12) of the side surfaces of the lead wire 32, the inorganic protective layer 2Pa and the first inorganic barrier layer 12 are all smaller than 90 degrees. Thus, the organic barrier layer 14 is not formed along these side surfaces. Therefore, moisture in the air does not reach the inside of the active region R1 via the organic barrier layer (solid portion)

14, and thus the display device 100 may have a high level of moisture-resistant reliability. In this example, the tapering angles θ(32), θ(2Pa) and θ(12) are all smaller than 90 degrees. The present invention is not limited to this. As long as the tapering angle θ(12) of the side surface of the first inorganic barrier layer 12 that forms a surface immediately below the inorganic barrier layer 14 is smaller than 90 degrees, the stack structure shown in FIG. 4(b) is formed; namely, the following portions are formed: a portion where the inorganic protective layer 2Pa and the first inorganic barrier layer 12 are in direct contact with each other (the organic flattening layer 2Pb is absent), and a portion where the first inorganic barrier layer 12 and the second inorganic barrier layer 16 are in direct contact with each other (the organic barrier layer 14 is absent). Therefore, moisture in the air is suppressed or prevented from entering the inside of the active region R1 via the organic flattening layer 2Pb or the organic barrier layer 14. The provision of the inorganic protective layer 2Pa decreases the tapering angle θ(12) of the first inorganic barrier layer 12. Therefore, even if the tapering angle θ(32) of the lead wire 32 is relatively large (e.g., 90 degrees), the tapering angle θ(12) of the first inorganic barrier layer 12 is allowed to be smaller than 90 degrees. Namely, the tapering angle θ(32) of the lead wire 32 is allowed to be 90 degrees or close to 90 degrees. This provides an advantage that the L/S of the lead wire 32 is decreased.

In the case where the tapering angle θ of the side surface is in the range of 70 degrees or larger and smaller than 90 degrees, the organic barrier layer (solid portion) 14 may be formed along the side surface. Needless to say, the resin present locally, namely, along the inclining side surface, is removed by ashing. However, the ashing is time-consuming. For example, the ashing needs to be performed for a long time even after the resin formed on the flat surface is removed. In addition, there may be a problem that as a result of the organic barrier layer (solid portion) formed in the vicinity of the particle P being excessively ashed (removed), the effect of the formation of the organic barrier layer is not sufficiently provided. In order to suppress or prevent this problem, the tapering angle θ(12) of the first inorganic barrier layer 12 is preferably smaller than 70 degrees, and more preferably smaller than 60 degrees.

Figure 6:
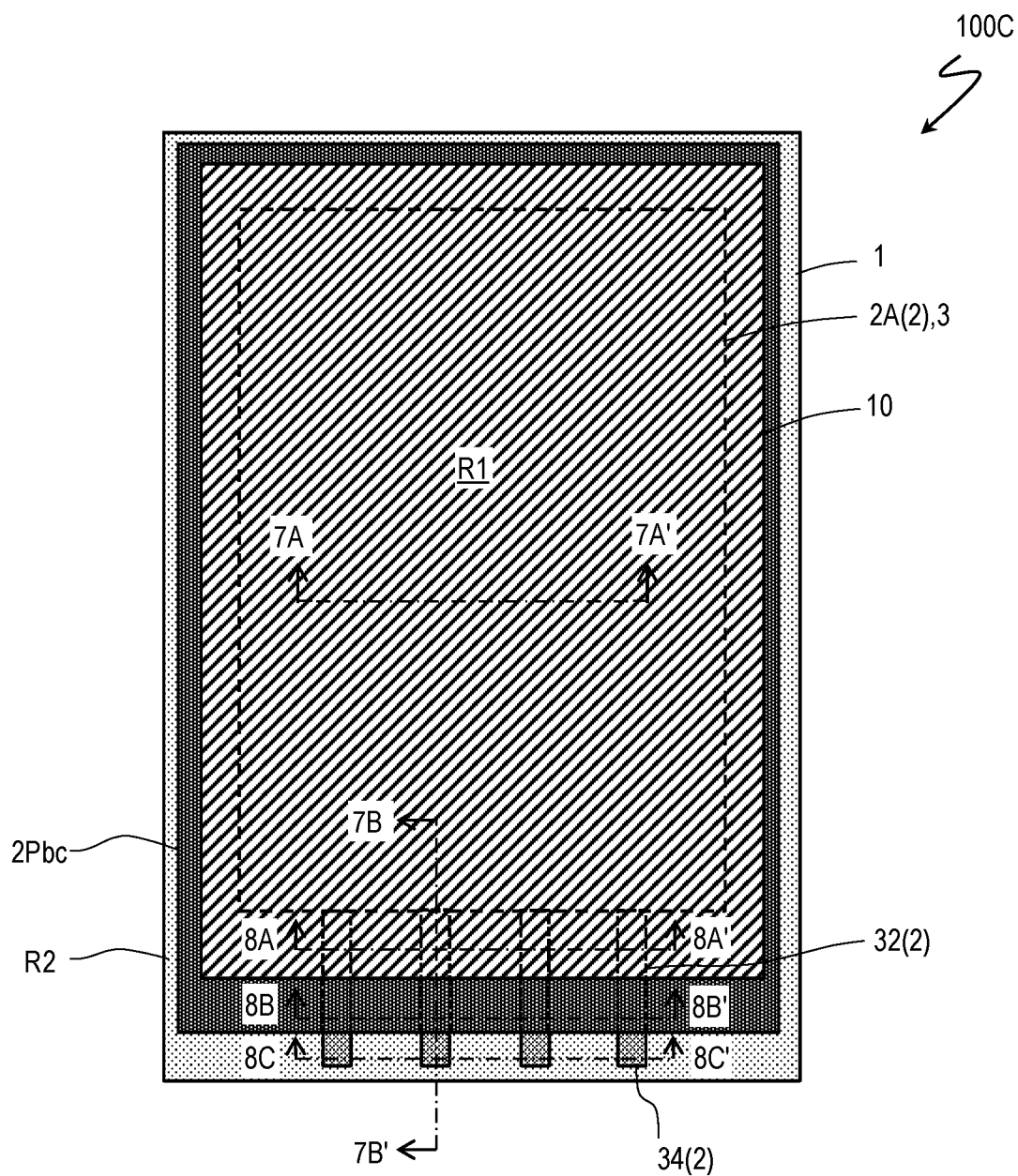
FIG. 6 is a schematic plan view of an OLED display device 100C in a comparative example.
Figure 7:
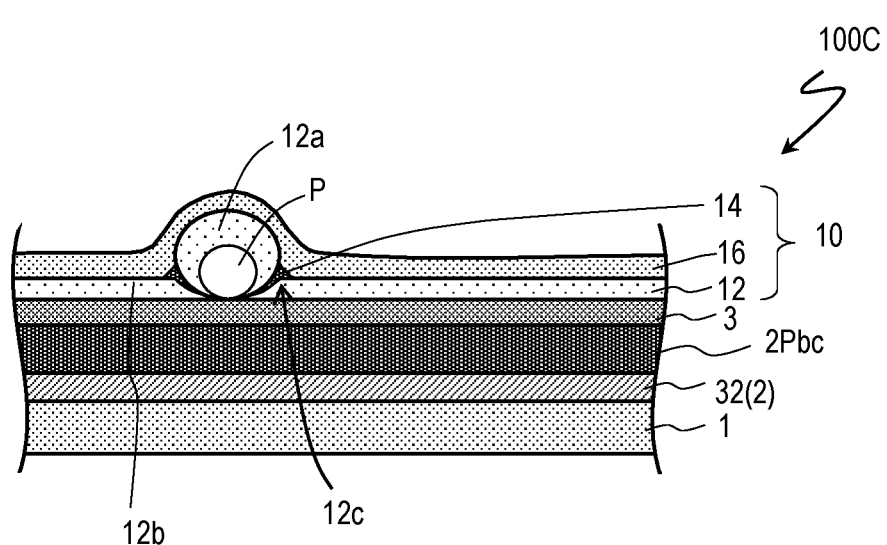
FIG. 7(a) and FIG. 7(b) are each a schematic cross-sectional view of the OLED display device 100C.
Figure 7:
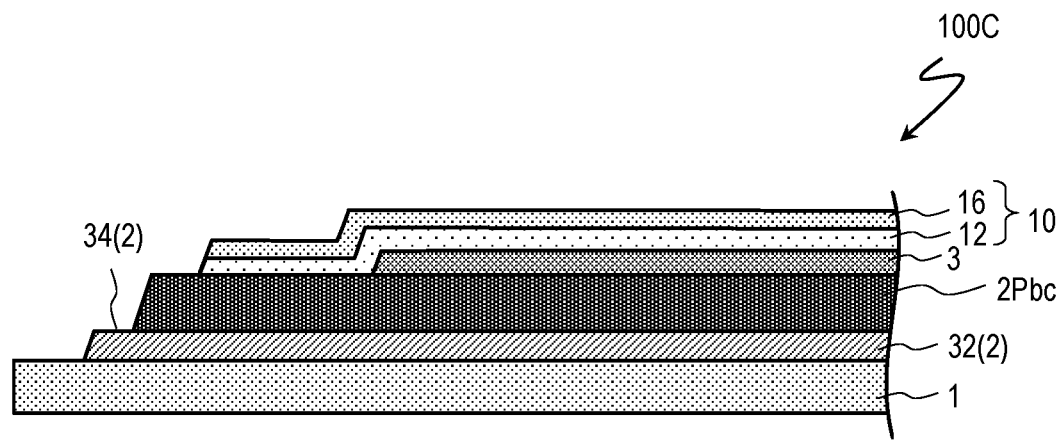
Figure 8:
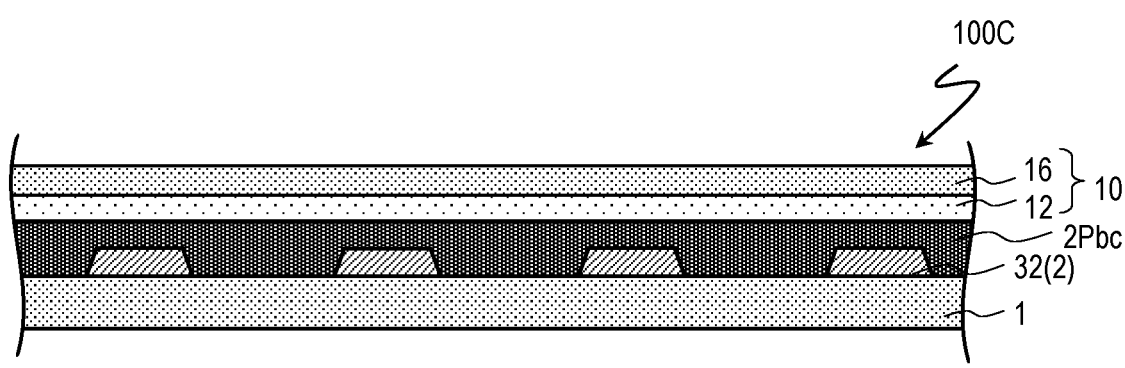
FIG. 8(a) through FIG. 8(c) are each a schematic cross-sectional view of the OLED display device 100C.
Figure 8:
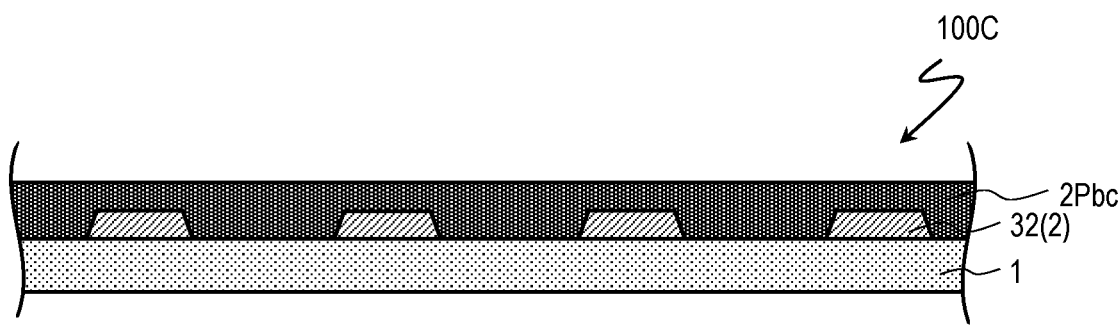
Figure 8:
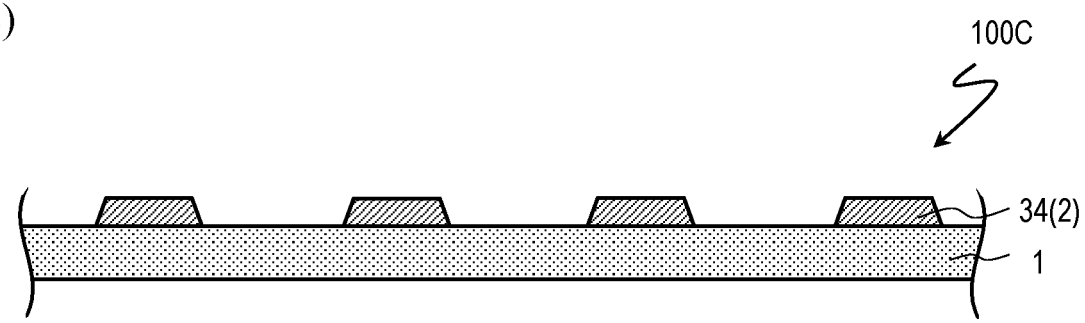

Now, with reference to FIG. 6 through FIG. 8, a structure of the OLED display device 100C in a comparative example will be described. FIG. 6 is a schematic plan view of the OLED display device 100C. FIG. 7(a) and FIG. 7(b) are each a schematic cross-sectional view of the OLED display device 100C. FIG. 7(a) is a cross-sectional view taken along line 7A-7A' in FIG. 6, and FIG. 7(b) is a cross-sectional view taken along line 7B-7B' in FIG. 6. FIG. 8(a) through FIG. 8(c) are each a schematic cross-sectional view of the OLED display device 100C. FIG. 8(a) is a cross-sectional view taken along line 8A-8A' in FIG. 6, FIG. 8(b) is a cross-sectional view taken along line 8B-8B' in FIG. 6, and FIG. 8(c) is a cross-sectional view taken along line 8C-8C' in FIG. 6.

Unlike the OLED display device 100 in the above-described embodiment, the OLED display device 100C does not include the inorganic protective layer 2Pa, and includes an organic flattening layer 2Pbc extending to a region not covered with the TFE structure 10. Components that are substantially the same as those in the OLED display device 100 will bear identical reference signs thereto and descriptions thereof will be omitted.

As is clear from, for example, FIG. 6, FIG. 7(b) and FIG. 8(b), a part of the organic flattening layer 2Pbc is exposed to the air (ambient atmosphere). In this case, the organic flattening layer 2Pbc absorbs moisture from the part exposed to the air and acts as a route that guides water vapor in the air onto the active region R1. By contrast, in the OLED display device 100 in the above-described embodiment, as shown in FIG. 3(b) and FIG. 4(b), the organic flattening layer 2Pb, together with the OLED layer 3, is enclosed by the joint portion where the inorganic protective layer 2Pa and the first inorganic barrier layer 12 are in direct contact with each other. Therefore, the above-described problem of the OLED display device 100C in the comparative example is solved by the OLED display device 100.

Figure 9:
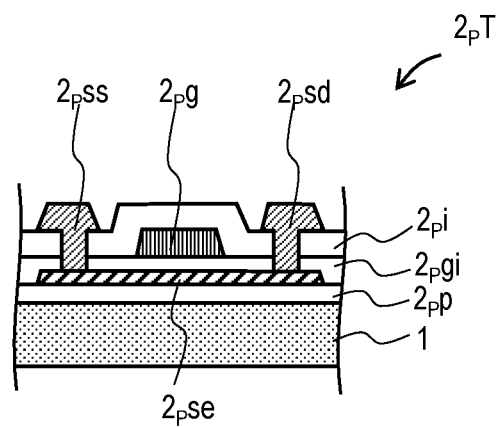
FIG. 9(a) and FIG. 9(b) are each a schematic cross-sectional view of an example of TFT included in an OLED display device in an embodiment.
Figure 9:
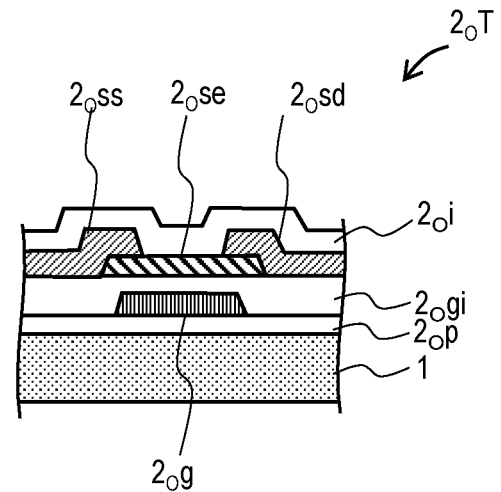
Figure 10:
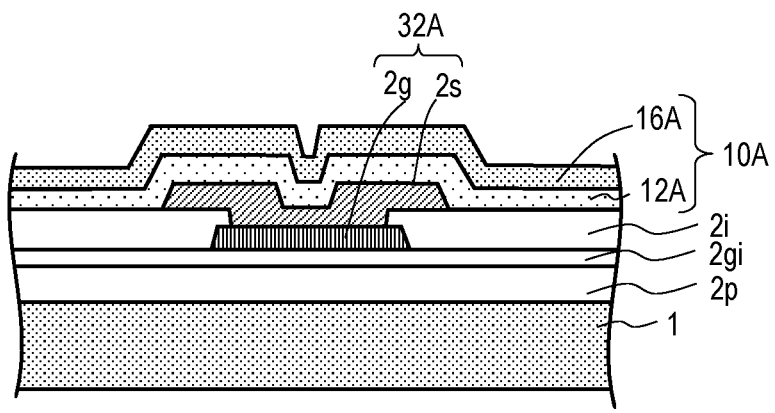
FIG. 10(a) through FIG. 10(a) are each a schematic cross-sectional view of another OLED display device in an embodiment, the schematic cross-sectional views respectively corresponding to FIG. 4(b) through FIG. 4(d).
Figure 10:
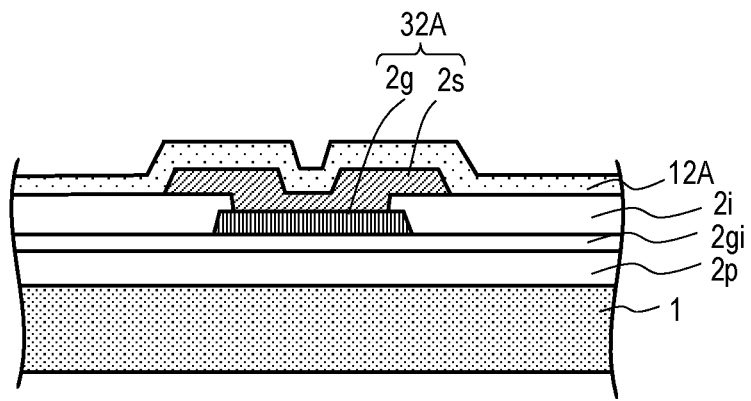
Figure 10:
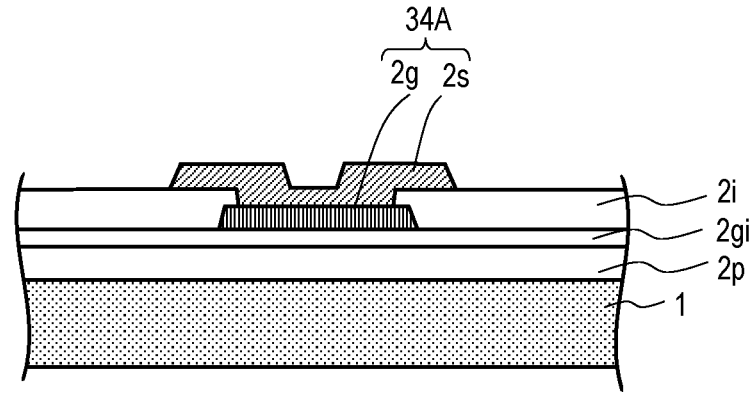

Now, with reference to FIG. 9 and FIG. 10, an example of TFT usable in the OLED display device 100, and an example of lead wire and terminal formed by use of a gate metal layer and a source metal layer used to form the formation of the TFT, will be described. The structures of the TFT, the lead wire and the terminal described below are usable for the OLED display device 100 in the above-described embodiment.

For a small- or medium-sized high-definition OLED display device, a low temperature polycrystalline silicon (hereinafter, referred to simply as "LTPS") TFT or an oxide TFT (e.g., four-component-based (In—Ga—Zn—O-based) oxide TFT containing In (Indium), Ga (gallium), Zn (zinc) and O (oxygen)) is preferably used. Structures of, and methods for producing, the LTPS-TFT and the In—Ga—Zn—O-based TFT are well known and will be briefly described below.

FIG. 9(a) is a schematic cross-sectional view of an LTPS-TFT $2_pT$. The TFT $2_pT$ may be included in the circuit 2 of the OLED display device 100. The LTPS-TFT $2_pT$ is a top gate-type TFT.

The TFT $2_pT$ is formed on a base coat $2_pp$ on the substrate 1 (e.g., polyimide film). Although not described above, it is preferred that a base coat formed of an inorganic insulating material is formed on the substrate 1.

The TFT $2_pT$ includes a polycrystalline silicon layer $2_p$se formed on the base coat $2_pp$, a gate insulating layer $2_p$gi formed on the polycrystalline silicon layer $2_p$se, a gate electrode $2_pg$ formed on the gate insulating layer $2_p$gi, an interlayer insulating layer $2_p$ss formed on the gate electrode $2_p$sd $2_pg$, and a source electrode $2_p$ss and a drain electrode $2_p$sd formed on the interlayer insulating layer $2_pi$. The source electrode $2_p$ss and the drain electrode $2_p$sd are respectively connected with a source region and a drain region of the polycrystalline silicon layer $2_p$se in contact holes formed in the interlayer insulating layer $2_pi$ and the gate insulating layer $2_p$gi.

The gate electrode $2_pg$ is contained in the gate metal layer containing the gate bus lines, and the source electrode $2_p$ss and the drain electrode $2_p$sd are contained in the source metal layer containing the source bus lines. The gate metal layer and the source metal layer are used to form the lead wire and the terminal (described below with reference to FIG. 10).

The TFT $2_pT$ is formed, for example, as follows.

As the substrate 1, a polyimide film having a thickness of 15 μm, for example, is prepared.

The base coat $2_pp$ (SiO$_2$ film: 250 nm/SiN$_x$ film: 50 nm/SiO$_2$ film: 500 nm (top layer/middle layer/bottom layer)) and an a-Si film (40 nm) are formed by plasma CVD.

The a-Si film is subjected to dehydrogenation (e.g., annealed at 450° C. for 180 minutes).

The a-Si film is made polycrystalline-siliconized by excimer laser annealing (ELA).

The a-Si film is patterned by a photolithography step to form an active layer (semiconductor island).

A gate insulating film ($SiO_2$ film: 50 nm) is formed by plasma CVD.

A channel region of the active layer is doped with (B').

The gate metal layer (Mo: 250 nm) is formed by sputtering and patterned by a photolithography step (including a dry etching step) (to form the gate electrode $2_pg$, the gate bus lines, and the like).

A source region and a drain region of the active layer are doped with ($P^+$).

Activation annealing (e.g., annealing at 450° C. for 45 minutes) is performed. As a result, the polycrystalline silicon layer $2_p$se is formed.

An interlayer insulating film (e.g., $SiO_2$ film: 300 nm/$SiN_x$ film: 300 nm (top layer/bottom layer)) is formed by plasma CVD.

The contact holes are formed in the gate insulating film and the interlayer insulating film by dry etching. As a result, the interlayer insulating layer $2_p$i and the gate insulating layer $2_p$gi are formed.

The source metal layer (Ti film: 100 nm/Al film: 300 nm/Ti film: 300 nm) is formed by sputtering and patterned by a photolithography step (including a dry etching step) (to form the source electrode $2_p$ss, the drain electrode $2_p$sd, the source bus lines, and the like).

After this, the above-described inorganic protective layer 2Pa (see FIG. 2 and FIG. 3) is formed.

FIG. 9(b) is a schematic cross-sectional view of an In—Ga—Zn—O-based TFT $2_oT$. The TFT $2_oT$ may be included in the circuit 2 of an OLED display device 100A. The TFT $2_oT$ is a bottom gate-type TFT.

The TFT $2_oT$ is formed on a base coat $2_op$ on the substrate 1 (e.g., polyimide film). The TFT $2_oT$ includes a gate electrode $2_og$ formed on the base coat $2_op$, a gate insulating layer $2_o$gi formed on the gate electrode $2_og$, an oxide semiconductor layer $2_o$se formed on the gate insulating layer $2_o$gi, and a source electrode $2_o$ss and a drain electrode $2_o$sd respectively formed on a source region and a drain region of the oxide semiconductor layer $2_o$se. The source electrode $2_o$ss and the drain electrode $2_o$sd are covered with an interlayer insulating layer $2_o$i.

The gate electrode $2_og$ is contained in the gate metal layer containing the gate bus lines, and the source electrode $2_o$ss and the drain electrode $2_o$sd are contained in the source metal layer containing the source bus lines. The gate metal layer and the source metal layer are used to form the lead wire and the terminal, and thus the TFT $2_oT$ may have the structure described below with reference to FIG. 10.

The TFT $2_oT$ is formed, for example, as follows.

As the substrate 1, a polyimide film having a thickness of 15 μm, for example, is prepared.

The base coat $2_op$ ($SiO_2$ film: 250 nm/$SiN_x$ film: 50 nm/$SiO_2$ film: 500 nm (top layer/middle layer/bottom layer)) is formed by plasma CVD.

The gate metal layer (Cu film: 300 nm/Ti film: 30 nm (top layer/bottom layer)) is formed by sputtering and patterned by a photolithography step (including a dry etching step) (to form the gate electrode $2_og$, the gate bus lines, and the like).

A gate insulating film ($SiO_2$ film: 30 nm/$SiN_x$ film: 350 nm (top layer/bottom layer)) is formed by plasma CVD.

An oxide semiconductor film (In—Ga—Z—O-based semiconductor film: 100 nm) is formed by sputtering and patterned by a photolithography step (including a wet etching step) to form an active layer (semiconductor island).

The source metal layer (Ti film: 100 nm/Al film: 300 nm/Ti film: 30 nm (top layer/medium layer/bottom layer)) is formed by sputtering and patterned by a photolithography step (including a dry etching step) (to form the source electrode $2_o$ss, the drain electrode $2_o$sd, the source bus lines, and the like).

Activation annealing (e.g., annealing at 300° C. for 120 minutes) is performed. As a result, the oxide semiconductor layer $2_o$se is formed.

After this, the interlayer insulating layer $2_o$i (e.g., $SiN_x$ film: 300 nm/$SiO_2$ film: 300 nm (top layer/bottom layer)) is formed by plasma CVD as a protection film. The interlayer insulating layer $2_o$i may also act as the inorganic protective layer 2Pa (see FIG. 2 and FIG. 3) described above. Needless to say, the inorganic protective layer 2Pa may further be formed on the interlayer insulating layer $2_o$i.

Now, with reference to FIG. 10(a) through FIG. 10(a), a structure of another OLED display device in an embodiment will be described. The circuit (back plane circuit) 2 of this OLED display device includes the TFT $2_pT$ shown in FIG. 9(a) or the TFT $2_oT$ shown in FIG. 9(b). The gate metal layer and the source metal layer used to form the TFT $2_pT$ or the TFT $2_oT$ is used to form a lead wire 32A and a terminal 34A. FIG. 10(a) through FIG. 10(c) respectively correspond to FIG. 4(b) through FIG. 4(d). Components corresponding to those in FIG. 4(b) through FIG. 4(d) will be represented by the identical reference signs provided with a letter "A" at the end. A base coat 2p in FIG. 10 corresponds to the base coat $2_pp$ in FIG. 9(a) and the base coat $2_op$ in FIG. 9(b). A gate insulating layer 2gi in FIG. 10 corresponds to the gate insulating layer $2_p$gi in FIG. 9(a) and the gate insulating layer $2_o$gi in FIG. 9(b). An interlayer insulating layer 2i in FIG. 10 corresponds to the interlayer insulating layer $2_p$i in FIG. 9(a) and the interlayer insulating layer $2_o$i in FIG. 9(b).

As shown in FIG. 10(a) through FIG. 10(a), a gate metal layer 2g and a source metal layer 2s are formed on the base coat 2p, which is formed on the substrate 1. Although not shown in FIG. 3 or FIG. 4, it is preferred a base coat formed of an inorganic insulating material is formed on the substrate 1.

As shown in FIG. 10(a) through FIG. 10(c), the lead wire 32A and the terminal 34A are formed as a stack body of the gate metal layer 2g and the source metal layer 2s. A part of each of the lead wire 32A and the terminal 34A that is formed of the gate metal layer 2g has, for example, the same cross-sectional structure as that of the gate bus lines. A part of each of the lead wire 32A and the terminal 34A that is formed of the source metal layer 2s has, for example, the same cross-sectional structure as that of the source bus lines. In a case of a 5.7-type display device of 500 ppi, the part formed of the gate metal layer 2g has a line width of, for example, 10 μm, and a distance between two adjacent such lines is 16 μm (L/S=10/16). The part formed of the source metal layer 2s has a line width of, for example, 16 μm, and a distance between two adjacent such lines is 10 μm (L/S=16/10). The tapering angle θ of each of the parts is smaller than 90 degrees, preferably smaller than 70 degrees, and more preferably smaller than, or equal to, 60 degrees. The tapering angle of a part formed below the organic flattening layer Pb may be larger than, or equal to, 90 degrees.

Figure 11:
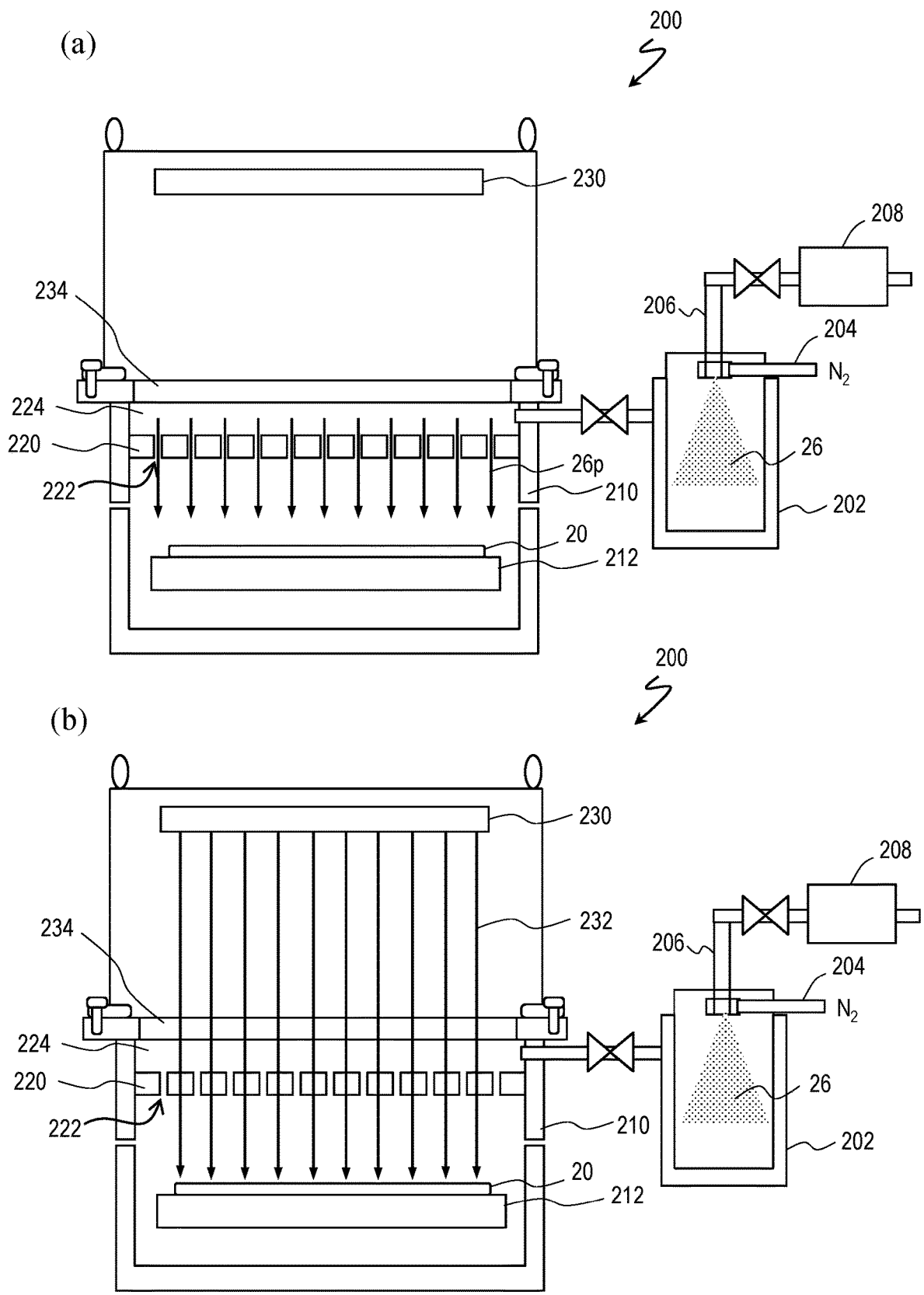
FIG. 11(a) and FIG. 11(b) each schematically show a structure of a film formation device 200.

Now, with reference to FIG. 11(a) and FIG. 11(b), a film formation device 200 usable to form an organic barrier layer, and a film formation method using the same will be described. FIG. 11(a) and FIG. 11(b) schematically show a structure of the film formation device 200. FIG. 11(a) shows a state of the film formation device 200 in a step of, in a chamber having a vapor-like or mist-like photocurable resin located therein, condensing the photocurable resin on the first inorganic barrier layer. FIG. 11(b) shows a state of the film formation device 200 in a step of irradiating the photocurable resin with light to which the photocurable resin is sensitive and thus curing the photocurable resin.

The film formation device 200 includes a chamber 210 and a partition wall 234 dividing the inside of the chamber 210 into two spaces. In one of the spaces demarcated by the partition wall 234, a stage 212 and a shower plate 220 are located. In the other space demarcated by the partition wall 234, an ultraviolet ray irradiation device 230 is located. The inner space of the chamber 210 is controlled to have a predetermined pressure (vacuum degree) and a predetermined temperature. The stage 212 has a top surface that receives an element substrate 20 including a plurality of OLEDs 3, on which the first inorganic barrier layer is formed. The top surface may be cooled down to, for example, −20° C.

The shower plate 220 is located to have a gap 224 between the shower plate 220 and the partition wall 234. The shower plate 220 has a plurality of through-holes 222. The gap 224 may have a size of, for example, 100 mm or greater and 1000 mm or less in a vertical direction. An acrylic monomer (in a vapor or mist state) supplied to the gap 224 is supplied, via the plurality of through-holes 222 of the shower plate 220, to one of the spaces of the chamber 210 in which the stage 212 is located. As necessary, the acrylic monomer is heated. The vapor-like or mist-like acrylic monomer 26p is attached to, or contacts, the first inorganic barrier layer included in the element substrate 20. The acrylic monomer 26p is supplied from a container 202 into the chamber 210 at a predetermined flow rate. The container 202 is supplied with the acrylic monomer 26p via a pipe 206 and also is supplied with nitrogen gas from a pipe 204. The flow rate of the acrylic monomer supplied to the container 202 is controlled by a mass flow controller 208. A material supply device includes the shower plate 220, the container 202, the pipes 204 and 206, the mass flow controller 208 and the like.

The ultraviolet ray irradiation device 230 includes an ultraviolet ray source and an optional optical element. The ultraviolet ray source may be, for example, an ultraviolet lamp (e.g., mercury lamp (encompassing a high-pressure lamp and a super-high pressure lamp), a mercury-xenon lamp or a metal halide lamp). The optical element includes, for example, a reflective mirror, a prism, a lens and a diffractive element.

The ultraviolet ray irradiation device 230, when being located at a predetermined position, directs light having a predetermined wavelength and a predetermined intensity toward the top surface of the stage 212. It is preferred that the partition wall 234 and the shower plate 220 are formed of a material having a high ultraviolet transmittance, for example, quartz.

The organic barrier layer 14 may be formed, for example, as follows by use of the film formation device 200. In this example, an acrylic monomer is used as the photocurable resin.

The acrylic monomer 26p is supplied into the chamber 210. The element substrate 20 has been cooled to, for example, −15° C. on the stage 212. The acrylic monomer 26p is condensed on the first inorganic barrier layer 12 in the element substrate 20. The conditions in this step may be controlled such that the acrylic monomer in a liquid state is present locally, namely, only around the protruding portion of the first inorganic barrier layer 12. Alternatively, the conditions may be controlled such that the acrylic monomer condensed on the first inorganic barrier layer 12 forms a liquid film.

The viscosity and/or the surface tension of the photocurable resin in the liquid state may be adjusted to control the thickness of the liquid film or the shape of the portion of the liquid film that is to be in contact with the protruding portion of the first inorganic barrier layer 12 (namely, the shape of the recessed portion). For example, the viscosity and the surface tension depend on the temperature. Therefore, the temperature of the element substrate may be adjusted to control the viscosity and the surface tension. For example, the size of the solid portion present on the flat portion may be controlled by the shape of a part of the liquid film that is to be in contact with the protruding portion of the first inorganic barrier layer 12 (namely, the shape of the recessed portion) and by the conditions of ashing to be performed in a later step.

Next, the acrylic monomer on the first inorganic barrier layer 12 is cured by use of the ultraviolet ray irradiation device 230, typically, by directing ultraviolet rays 232 toward the entirety of a top surface of the element substrate 20. As the ultraviolet ray source, for example, a high pressure mercury lamp that provides light having a main peak at 365 nm is used. The ultraviolet rays are directed at an intensity of, for example, 12 mW/cm² for about 10 seconds.

The organic barrier layer 14 of an acrylic resin is formed in this manner. The tact time of the step of forming the organic barrier layer 14 is shorter than about 30 seconds. Thus, the mass-productivity is very high.

Alternatively, after the photocurable resin in the liquid state is cured and ashing is performed, the organic barrier layer 14 may be formed only around the protruding portion. Even in the case where the organic barrier layer 14 is formed by curing the photocurable resin present locally, ashing may be performed. The ashing may improve the adhesiveness between the organic barrier layer 14 and the second inorganic barrier layer 16. Namely, the ashing may be used to modify (make hydrophilic) the surface of the organic barrier layer 14, as well as to remove an excessive portion of the organic barrier layer formed.

The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet ray irradiation, may be performed. In the case where an $SiN_x$ film is formed by CVD as the first inorganic barrier layer 12 and the second inorganic barrier layer 16, $N_2O$ is used as a material gas. Therefore, use of $N_2O$ for the ashing provides an advantage that the device is simplified.

In the case where the ashing is performed, the surface of the organic barrier layer 14 is oxidized and thus is modified to be hydrophilic. In addition, the surface of the organic barrier layer 14 is shaved almost uniformly and extremely tiny ruggedness is formed, and thus the surface area size is enlarged. The effect of enlarging the surface area size provided by the ashing is greater for the surface of the organic barrier layer 14 than for the first inorganic barrier layer 12 formed of an inorganic material. Since the surface of the organic barrier layer 14 is modified to be hydrophilic and the surface area size thereof is enlarged, the adhesiveness of the organic barrier layer 14 with the second inorganic barrier layer 16 is improved.

After the above, the resultant body is transported to a CVD chamber in order to form the second inorganic barrier layer 16. The second inorganic barrier layer 16 is formed under, for example, the same conditions for the first inorganic barrier layer 12. The second inorganic barrier layer 16 is formed in the region where the first inorganic barrier layer 12 is formed. Therefore, the inorganic barrier layer joint portion were the first inorganic barrier layer 12 and the second inorganic barrier layer 16 are in direct contact with each other is formed in the non-solid portion of the organic barrier layer 14. Therefore, as described above, water vapor in the air is suppressed or prevented from reaching the inside of the active region via the organic barrier layer.

The first inorganic barrier layer 12 and the second inorganic barrier layer 16 are formed, for example, as follows. An inorganic barrier layer having a thickness of 400 nm may be formed by plasma CVD using $SiH_4$ gas and $N_2O$ gas, at a film formation rate of 400 nm/min, in a state where, for example, the temperature of the substrate as a target of the film formation (OLED 3) is controlled to be lower than, or equal to, 80° C. The inorganic barrier layer thus formed has a refractive index of 1.84 and a 400 nm visible light transmittance of 90% (thickness: 400 nm). The film stress has an absolute value of 50 MPa.

The inorganic barrier layer may be an $SiO_2$ layer, an $SiO_xN_y$ (x>y) layer, an $SiN_xO_y$ (x>y) layer, an $Al_2O_3$ layer or the like as well as an $SiN_x$ layer. The photocurable resin contains, for example, a vinyl group-containing monomer. Among such monomers, an acrylic monomer is preferably used. The acrylic monomer may be mixed with a photoinitiator when necessary. Any of various known acrylic monomers is usable. A plurality of acrylic monomers may be mixed. For example, a bifunctional monomer and a trifunctional or higher-level multi-functional monomer may be mixed. An oligomer may be mixed. The viscosity of the photocurable resin at room temperature (e.g., 25° C.), before the photocurable resin is cured, preferably does not exceed 10 Pa·s, and especially preferably is in 1 to 100 mPa·s. In the case where the viscosity is too high, it may be difficult to form a thin liquid film having a thickness less than, or equal to, 500 nm.

In the above, an OLED display device including a flexible substrate and a method for producing the same are described. An embodiment of the present invention is not limited to the devices or methods described above. An embodiment of the present invention is widely applicable to an organic EL device including an organic EL element including a non-flexible substrate (e.g., glass substrate) and a thin film encapsulation structure formed on the organic EL element (for example, to an organic EL illumination device).

INDUSTRIAL APPLICABILITY

An embodiment of the present invention is applicable to an organic EL device and a method for producing the same. Especially, an embodiment of the present invention is applicable to a flexible organic EL display device and a method for producing the same.

REFERENCE SIGNS LIST

1: Flexible substrate
2: Back plane (circuit)
3: Organic EL element
4: Polarization plate
10: Thin film encapsulation structure (TFE structure)
12: First inorganic barrier layer ($SiN_x$ layer)
14: Organic barrier layer (acrylic resin layer)
16: Second inorganic barrier layer ($SiN_x$ layer)
20: Element substrate
26: Acrylic monomer
26p: Vapor-like or mist-like acrylic monomer
100, 100C: Organic EL display device
200 Film formation device

The invention claimed is:

1. An organic electroluminescent device, comprising:
   a substrate;
   a driving circuit layer including a plurality of TFTs formed on the substrate, a plurality of gate bus lines and a plurality of source bus lines each connected with any of the plurality of TFTs, a plurality of terminals, and a plurality of lead wires connecting each of the plurality of terminals with either one of the plurality of gate bus lines or either one of the plurality of source bus lines;
   an inorganic protective layer formed on the driving circuit layer and exposing at least the plurality of terminals;
   an organic flattening layer formed on the inorganic protective layer;
   an organic electroluminescent element layer formed on the organic flattening layer and including a plurality of organic electroluminescent elements each connected with either one of the plurality of TFTs; and
   a thin film encapsulation structure formed to cover the organic electroluminescent element layer, the thin film encapsulation structure including a first inorganic barrier layer, an organic barrier layer in contact with a top surface of the first inorganic barrier layer, and a second inorganic barrier layer in contact with a top surface of the organic barrier layer, the organic barrier layer being formed in a region enclosed by an inorganic barrier layer joint portion where the first inorganic barrier layer and the second inorganic barrier layer are in direct contact with each other;
   wherein:
   as seen in a direction of normal to the substrate, the organic flattening layer is formed in a region where the inorganic protective layer is formed, the plurality of organic electroluminescent elements are located in a region where the organic flattening layer is formed, and an outer perimeter of the thin film encapsulation structure crosses the plurality of lead wires and is present between an outer perimeter of the organic flattening layer and an outer perimeter of the inorganic protective layer; and
   in a region where the inorganic protective layer and the first inorganic barrier layer are in direct contact with each other on the plurality of lead wires, a tapering angle of a side surface of a cross-section of the first inorganic barrier layer taken along a plane parallel to a width direction of the plurality of lead wires is smaller than 90 degrees.

2. The organic electroluminescent device according to claim 1, wherein the tapering angle of the side surface of the first inorganic barrier layer is smaller than 70 degrees.

3. The organic electroluminescent device according to claim 1, wherein the organic flattening layer is formed of a photosensitive resin.

4. The organic electroluminescent device according to claim 1, wherein the organic flattening layer is formed of polyimide.

5. A method for producing the organic electroluminescent device according to claim 1, the method comprising:
   step A of forming the driving circuit layer on the substrate;
   step B of forming the inorganic protective layer on the driving circuit layer;

step C of forming the organic flattening layer on the inorganic protective layer;
step D of heating the organic flattening layer to a temperature higher than, or equal to, 200° C.; and
step E of forming the organic electroluminescent element layer on the organic flattening layer after the step of heating.

6. The method according to claim 5, further comprising step C1 of forming a positive photoresist film covering the organic flattening layer and step C2 of exposing and then developing the entirety of the photoresist film to remove the photoresist film, the step C1 and the step C2 being performed after the step C but before the step D.

7. The method according to claim 6, further comprising the step of storing or transporting the substrate having the photoresist film formed thereon between the step C1 and the step C2.

8. The method according to claim 5, further comprising:
step F of, after the step E, forming the first inorganic barrier layer selectively in an active region where the plurality of organic electroluminescent elements are formed;
step G of, after the step F, locating the substrate in a chamber and supplying a vapor-like or mist-like photocurable resin into the chamber;
step H of condensing the photocurable resin on the first inorganic barrier layer such that the photocurable resin is not present on a part of the first inorganic barrier layer, the part having the tapering angle smaller than 90 degrees; and
step I of, after the step H, irradiating the condensed photocurable resin with light to form the organic barrier layer of the photocurable resin.

9. The method according to claim 5, further comprising:
step F, after the step E, forming the first inorganic barrier layer selectively in an active region where the plurality of organic electroluminescent elements are formed;
step G of, after the step F, locating the substrate in a chamber and supplying a vapor-like or mist-like photocurable resin into the chamber;
step H of condensing the photocurable resin on the first inorganic barrier layer to form a liquid film;
step I of irradiating the liquid film of the photocurable resin with light to form a photocurable resin layer; and
step J of partially ashing the photocurable resin layer to form the organic barrier layer.

* * * * *